United States Patent
Roy et al.

(10) Patent No.: US 6,815,986 B2
(45) Date of Patent: Nov. 9, 2004

(54) DESIGN-FOR-TEST TECHNIQUE FOR A DELAY LOCKED LOOP

(75) Inventors: Aninda Roy, San Jose, CA (US); Claude Gauthier, Fremont, CA (US); Brian Amick, Austin, TX (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 170 days.

(21) Appl. No.: 10/196,622

(22) Filed: Jul. 16, 2002

(65) Prior Publication Data

US 2004/0012420 A1 Jan. 22, 2004

(51) Int. Cl.[7] .............................................. H03L 7/06
(52) U.S. Cl. ..................... 327/149; 327/158; 324/76.53; 324/76.54
(58) Field of Search ............................... 327/147, 149, 327/150, 156, 158, 161; 713/501; 331/1 R, 25; 324/76.53, 76.54

(56) References Cited

U.S. PATENT DOCUMENTS

| | | | | |
|---|---|---|---|---|
| 5,374,900 A | * | 12/1994 | Masumoto | ................... 331/1 A |
| 5,594,361 A | * | 1/1997 | Campbell | ..................... 326/24 |
| 5,600,284 A | * | 2/1997 | Nguyen et al. | ......... 331/177 R |
| 5,621,739 A | * | 4/1997 | Sine et al. | ................... 714/724 |
| 5,663,991 A | * | 9/1997 | Kelkar et al. | ................ 375/376 |
| 5,877,656 A | * | 3/1999 | Mann et al. | ..................... 331/16 |
| 5,991,888 A | * | 11/1999 | Faulkner et al. | ............. 713/501 |
| 6,002,281 A | * | 12/1999 | Jones et al. | ................. 327/161 |
| 6,469,493 B1 | * | 10/2002 | Muething et al. | ......... 324/158.1 |
| 6,476,594 B1 | * | 11/2002 | Roisen | ..................... 324/76.54 |

OTHER PUBLICATIONS

20030038619, Boateng, Feb. 27, 2003.*
"A Semidigital Dual Delay–Locked Loop" by Stefanos Sidiropoulos and Mark A. Horowitz, IEEE Journal of Solid–State Circuits, vol. 32, No. 11, Nov. 1997 (10 pages).

* cited by examiner

*Primary Examiner*—Tuan T. Lam
(74) *Attorney, Agent, or Firm*—Osha & May L.L.P.

(57) ABSTRACT

A delay locked loop implementing design-for-test features to test for, among other, stuck-at-faults is provided. The delay locked loop uses multiplexers as design-for-test devices for controllability purposes and flip-flops as design-for-test devices for observability purposes. Such implementation of design-for-test features within a delay locked loop allows for pre-packaging delay locked loop verification and testing.

21 Claims, 10 Drawing Sheets

DESIGN-FOR-TEST TECHNIQUE FOR A DELAY LOCKED LOOP

BACKGROUND OF INVENTION

Figure 1:
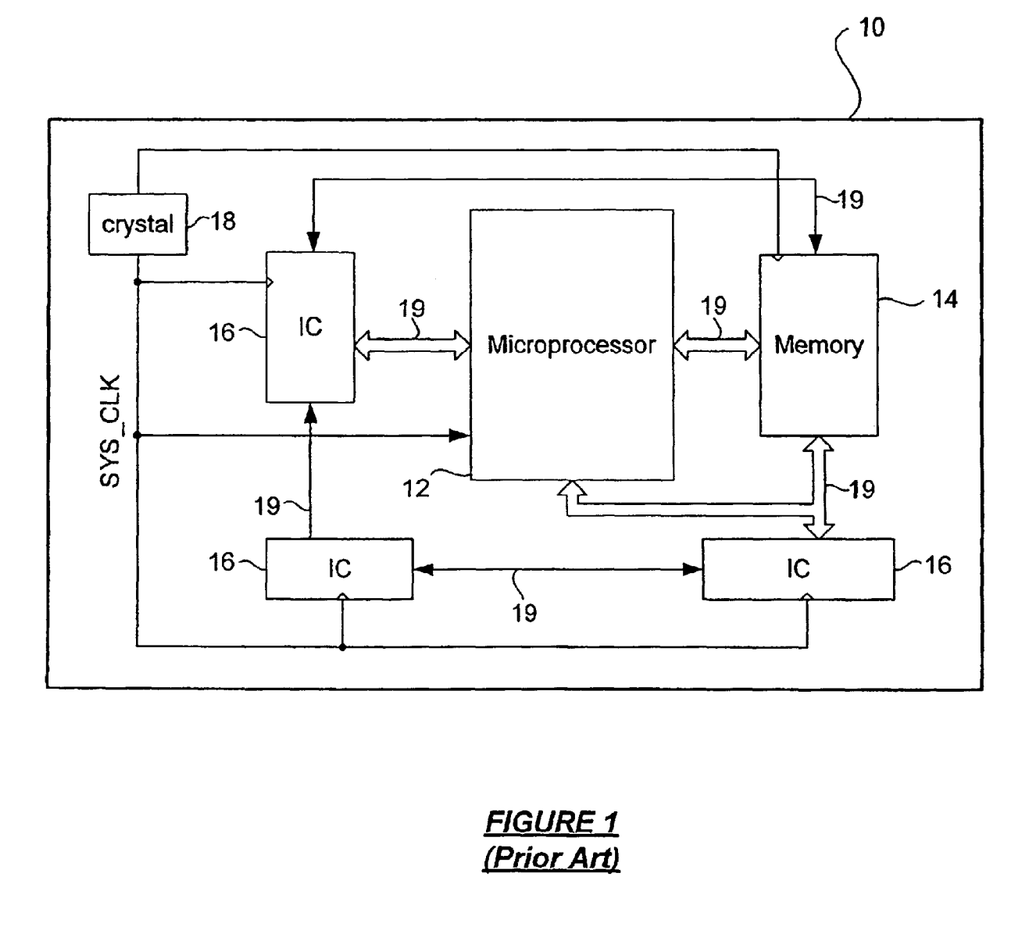
FIG. 1 shows a typical computer system.

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via a communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (referred to and known in the art as "reference clock" and shown in FIG. 1 as SYS_CLK) to various parts of the computer system 10. Modem microprocessors and other integrated circuits, however, are typically capable of operating at frequencies significantly higher than the system clock, and thus, it becomes important to ensure that operations involving the microprocessor 12 and the other components of the computer system 10 use a proper and accurate reference of time.

Accordingly, as the frequencies of modem computers continue to increase, the need to rapidly transmit data between circuit interfaces also increases. To accurately receive data, a clock signal is often transmitted to help recover data transmitted to a receiving circuit by some transmitting circuit. The clock signal determines when the data should be sampled by the receiving circuit. In some cases, the clock signal may change state at the beginning of the time the data is valid. However, this is typically undesirable because the receiving circuit operates better when the clock signal is detected during the middle of the time the data is valid. In other cases, the clock signal may degrade as it propagates from its transmission point. Such degradation may result from process, voltage, and/or temperature variations that directly or indirectly affect the clock signal. To guard against the adverse effects of poor and inaccurate clock signal transmission, a delay locked loop ("DLL") is commonly used to generate a copy of the clock signal at a fixed phase shift with respect to the original clock signal.

Figure 2:
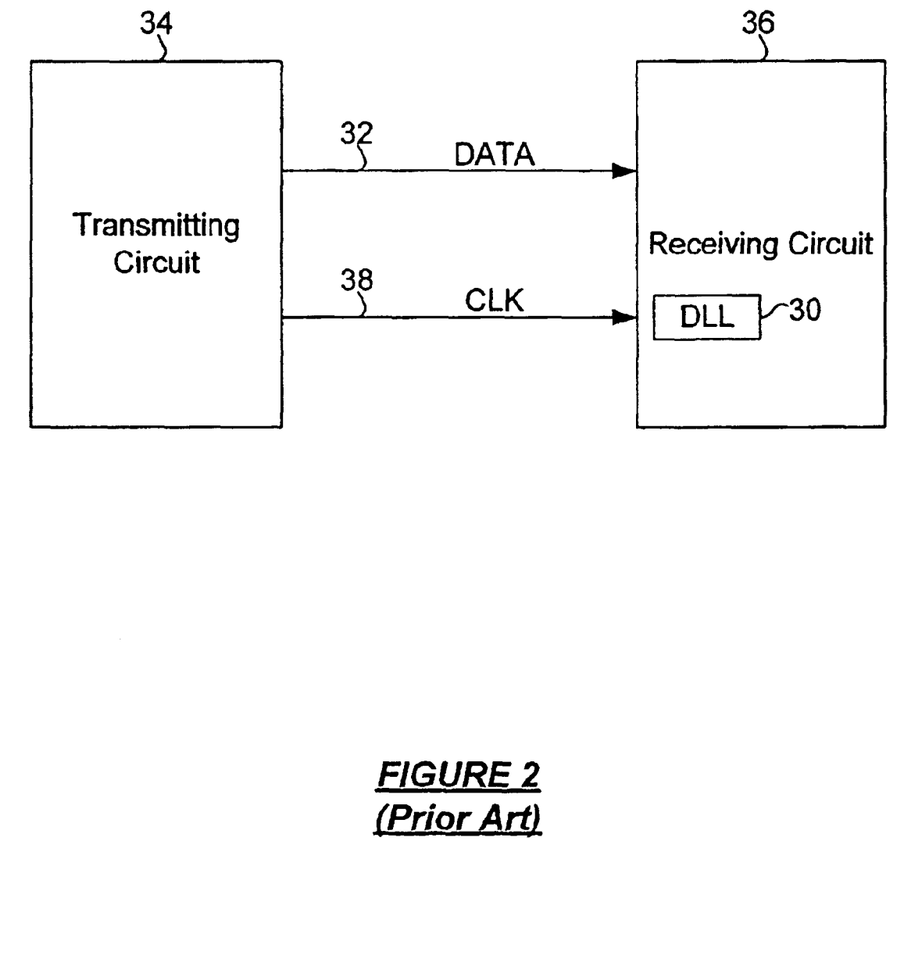
FIG. 2 shows a portion of a typical computer system in which a DLL is used.

FIG. 2 shows a portion of a typical computer system in which a DLL 30 is used. In FIG. 2, data 32 is transmitted from a transmitting circuit 34 to a receiving circuit 36. To aid in the recovery of the data 32 by the receiving circuit 36, a clock signal 38 is transmitted along with the data 32. To ensure that the data 32 is properly latched by the receiving circuit 36, the DLL 30 (which in FIG. 2 is shown as being part of the receiving circuit 36) regenerates the clock signal 38 to a valid voltage level and creates a phase shifted version of the clock signal 38. Accordingly, the use of the DLL 30 in this fashion ensures (1) that the data 32 is properly latched by triggering the receiving circuit 36 at a point in time in which the data 32 is valid and (2) that the clock signal 38 is buffered by the receiving circuit 36.

Figure 3:
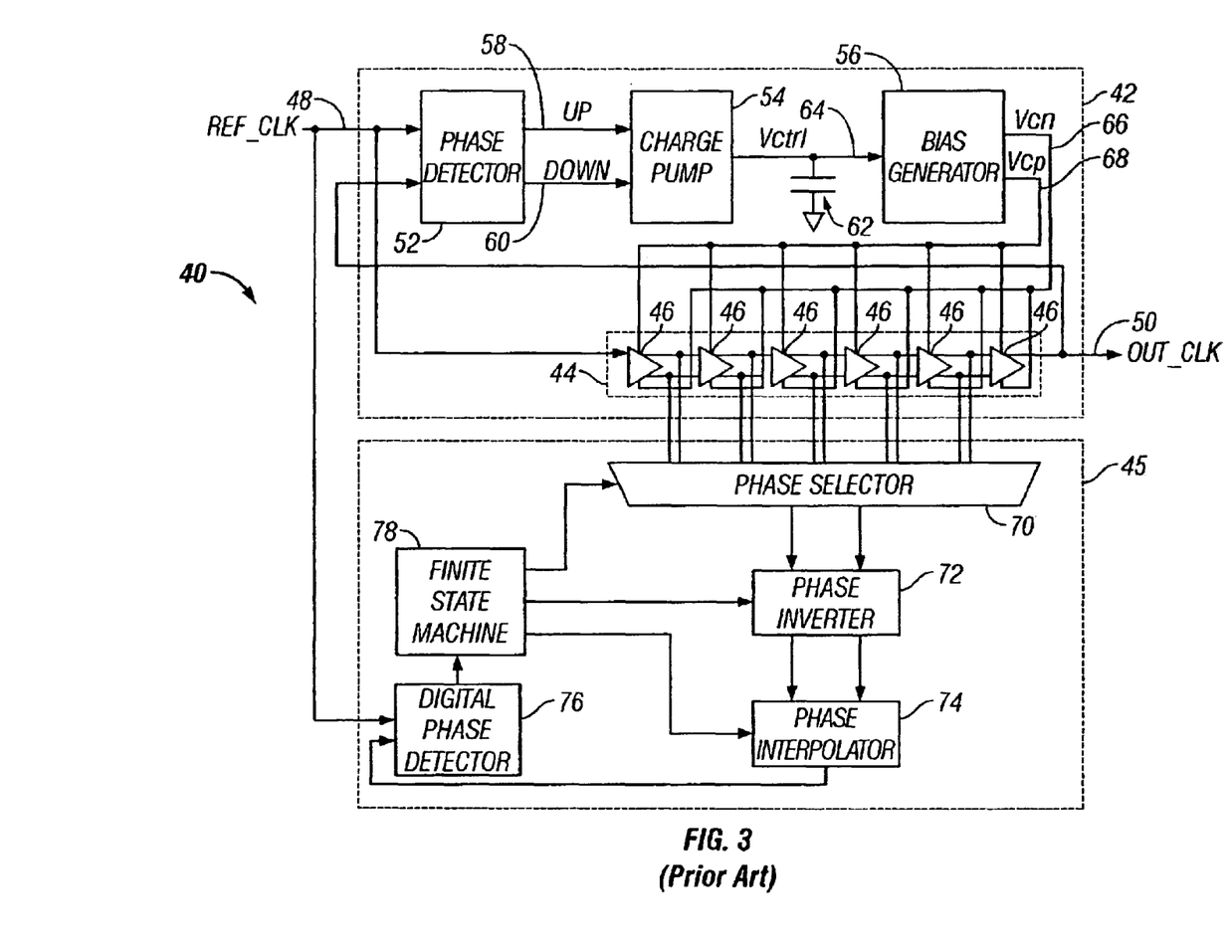
FIG. 3 shows a typical DLL.

FIG. 3 shows a configuration of a typical DLL 40. The DLL 40 includes a cascade of two loops. The first loop 42 includes a voltage-controlled delay line 44, composed of several delay elements 46, that inputs a reference clock, ref_elk 48, and outputs an output clock, out_elk 50, that is shifted 180 degrees from the reference clock 48. A delay of the voltage-controlled delay line 44 is controlled by a feedback system including a phase detector 52, a charge pump 54, and a bias generator 56. The phase detector 52 detects any phase offset between the reference clock 48 and the output clock 50 and generates UP 58 and DOWN 60 pulses that control the charge pump 54. Depending on the UP 58 and DOWN 60 pulses, the charge pump 54 transfers charge to or from a filter capacitor 62, thereby generating a control voltage, $V_{ctrl}$ 64. The bias generator 56 inputs the control voltage 64 and produces bias voltages $V_{cn}$ 66 and $V_{cp}$ 68 that adjust the delay of the delay elements 46 in the voltage-controlled delay line 44 such that the delay of the voltage-controlled delay line 44 is proportional to a phase shift of 180 degrees from the reference clock 48.

The second loop 45 is an 'interpolating' loop that takes the outputs of the delay elements 46 in the voltage-controlled delay line 44 and produces an interpolated clock signal that is locked in phase, i.e., 0 degrees phase offset, with the reference clock 48. This is accomplished through a plurality of stages. A first group of clock signal from a pair of successive delay elements 46 are selected by an analog multiplexer known as a 'phase selector' 70. The selected delay element 46 outputs are then inverted by a phase inverter 72 is required. A phase interpolator 74 then interpolates between the output pair of clock signals from the phase inverter 72, thereby generating a clock signal that is places between the phase inverter 72 outputs. The output from the phase interpolator 74 is then compared to the reference clock 48 using a digital phase detector 76. The digital phase detector 76 detects the phase offset between the interpolated clock signal and the reference clock 48, and its output serves as an input to a finite state machine 78 that adjusts (1) interpolating weights in the phase interpolator 74, (2) select signals in the phase selector 70, and (3) the phase inversion in the phase inverter 72.

The use of DLLs, such as the one described above with reference to FIG. 3, is becoming increasingly important with the advent of modern high-speed high-bandwidth processors. Additionally, because a DLL typically occupies a significant amount of integrated circuit space, DLL implementation is becoming a significant concern for circuit designers and the like.

SUMMARY OF INVENTION

According to one aspect of the present invention, an integrated circuit having a delay locked loop comprises: a phase detector that inputs a reference clock signal and an output clock signal from the delay locked loop; a charge pump, responsive to an output from the phase detector, that outputs a control voltage signal; a bias generator that generates at least one bias signal dependent on the control voltage signal; a voltage-controlled delay line, responsive to the at least one bias signal, that outputs the output clock signal, where the voltage-controlled delay line comprises a plurality of delay elements that each comprise an NMOS device and a PMOS device; a first plurality of design-for-test devices positioned at inputs to NMOS devices in the plurality of delay elements; and a second plurality of design-for-test devices positioned at inputs to PMOS devices in the plurality of delay elements.

According to another aspect, an integrated circuit having a delay locked loop comprises: means for inputting a reference clock signal and an output clock signal from the delay locked loop; means for outputting a control voltage signal dependent on the means for inputting the reference clock signal and the output clock signal; means for generating at least one bias signal dependent on the control voltage signal; means for outputting the output clock signal dependent on the at least bias signal, where the means for outputting the output clock signal comprises a plurality of delay elements that each comprise an NMOS device and a PMOS device; first testing means for testing the delay locked loop, where the first testing means is positioned at inputs to NMOS devices in the plurality of delay elements; and second testing means for testing the delay locked loop, where the second testing means is positioned at inputs to PMOS devices in the plurality of delay elements.

According to another aspect, a method for manufacturing a delay locked loop comprises: operatively connecting a phase detector that is arranged to input a reference clock signal and an output clock signal from the delay locked loop to a charge pump, where the charge pump is arranged to output a control voltage signal; operatively connecting the charge pump to a bias generator, where the bias generator is arranged to output at least one bias signal dependent on the control voltage signal; operatively connecting the bias generator to a voltage-controlled delay line, where the voltage-controlled delay line comprises a plurality of delay elements that each comprise an NMOS and a PMOS device; positioning a first plurality of design-for-test device at inputs to NMOS devices in the plurality of delay elements; and positioning a second plurality of design-for-test devices at inputs to PMOS devices in the plurality of delay elements.

According to another aspect, a method for performing operations using a delay locked loop comprises: inputting a reference clock signal and an output clock signal from the delay locked loop; outputting a control voltage signal dependent on the means for inputting the reference clock signal and the output clock signal; generating at least one bias signal dependent on the control voltage signal; outputting the output clock signal dependent on the at least bias signal, where outputting the output clock signal is dependent on a plurality of delay elements that each comprise an NMOS device and a PMOS device; and testing the delay locked loop, where the testing uses a first plurality of devices positioned at inputs to NMOS devices in the plurality of delay elements.

According to another aspect, an integrated circuit having a delay locked loop comprises: a phase detector that inputs a reference clock signal and an output clock signal from the delay locked loop; a first design-for-test device positioned at an output of the phase detector; a charge pump, responsive to an output from the phase detector, that outputs a control voltage signal; a bias generator that generates at least one bias signal dependent on the control voltage signal; and a voltage-controlled delay line, responsive to the at least one bias signal, that outputs the output clock signal.

According to another aspect, an integrated circuit having a delay locked loop comprises: a phase detector arranged to input a reference clock signal and an output clock signal from the delay locked loop; a charge pump, responsive to an output from the phase detector, arranged to output a control voltage signal; a bias generator arranged to generate at least one bias signal dependent on the control voltage signal; a voltage-controlled delay line, responsive to the at least one bias signal, arranged to output the output clock signal; and a design-for-test device operatively connected to at least one selected from the group consisting the phase detector, the charge pump, the bias generator, and the voltage-controlled delay line.

Other aspects and advantages of the invention will be apparent from the following description and the appended claims.

DETAILED DESCRIPTION

Embodiments of the present invention relate to a technique for testing and verifying the operation of a DLL. More particularly, embodiments of the present invention relate to DLL design in which design-for-test ("DFT") features, e.g., design-for-test devices, are implemented to test for, among others, stuck-at faults.

Figure 4:
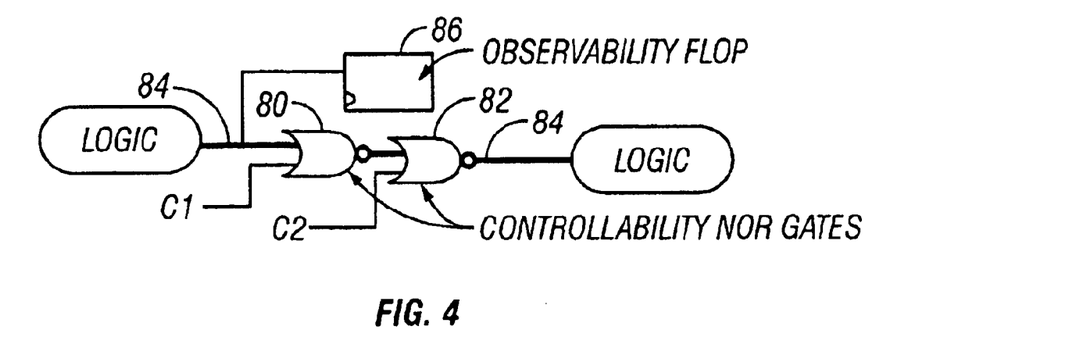
FIG. 4 shows an approach used to implement design-for-test features.
Figure 5:
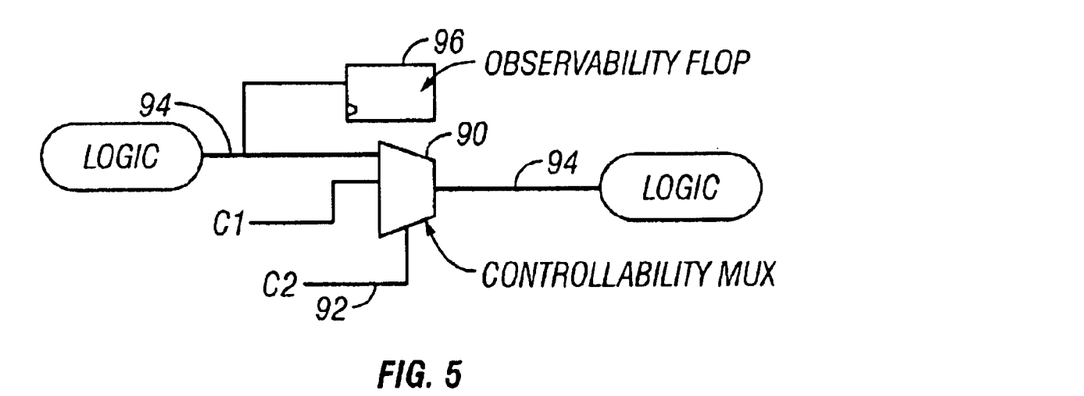
FIG. 5 shows another approach used to implement design-for-test features.

Testing for stuck-at faults requires that signal nodes in a design are made controllable and observable by a test apparatus. 'Controllability' is the ability to establish a desired value on a particular signal node by applying test stimuli. 'Observability' is the ability to determine the value of a particular signal node. FIGS. 4 and 5 show approaches in which controllability and observability are facilitated using design-for-test devices.

In FIG. 4, a first NOR gate 80 is positioned to receive a signal of interest 84 and second NOR gate 82 is positioned to receive an output of the first NOR gate 80. Accordingly, by controlling the remaining inputs of the first and second NOR gates 80 and 82, a desired voltage value may be established on the signal of interest 84. To implement observability, an input to a scannable device 86, such as a scannable flip-flop, is wire-ORed to the signal of interest 84, thereby providing the ability to latch data on the signal of interest 84.

In FIG. 5, a multiplexer 90 is positioned to receive the signal of interest 94. In order to implement controllability, a select signal 92 to the multiplexer 90 is used to select what value to establish on the signal of interest 94. For observability purposes, an input to a scannable device 96, such as a scannable flip-flop, is wire-ORed to the signal of interest 94, thereby providing the ability to latch data on the signal of interest 94.

Figure 6:
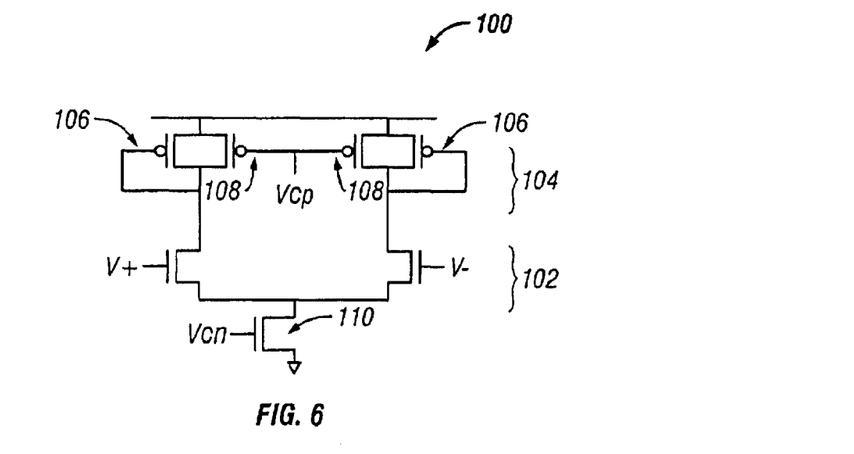
FIG. 6 shows a circuit schematic of a portion of a DLL.

To better understand the application of DFT features in a DLL, FIGS. 6–9 show exemplary circuit schematics of portions of a first loop of a DLL. FIG. 6 shows a circuit schematic of a delay element 100 that is used in a voltage-controlled delay line of a DLL. The delay element 100 is essentially a differential buffer composed of an NMOS source-coupled differential input pair 102 and a PMOS resistive load 104 formed by diode-connected PMOS transistors 106 and triode-connected PMOS transistors 108. The bias voltages of the tail-current NMOS transistors 110 and the triode-connected PMOS transistors 108 are adjusted to change the delay of the delay element 100.

Figure 7:
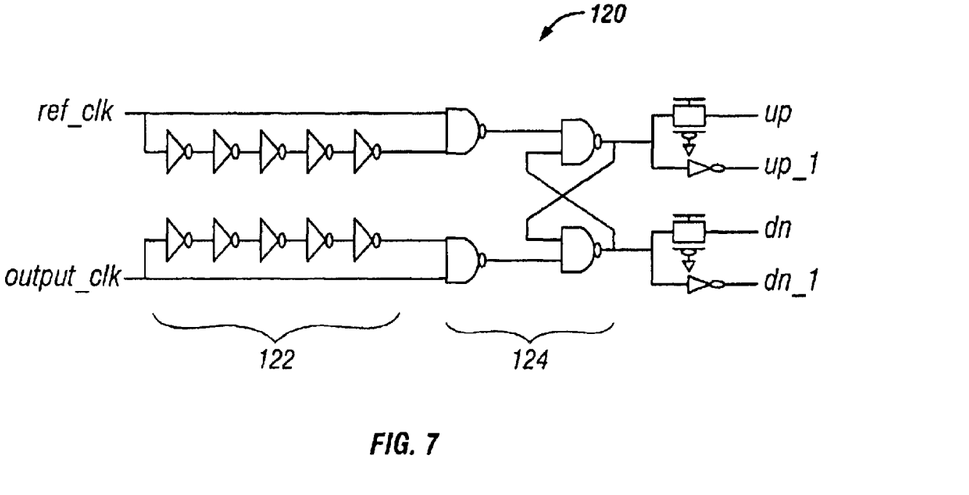
FIG. 7 shows a circuit schematic of a portion of a DLL.

FIG. 7 shows a circuit schematic of a phase detector 120 that is used in a DLL. The phase detector 120 is essentially an S-R latch phase detector 124 augmented with pulse generators 122 at its reference clock and output clock inputs. The pulse generators 122 remove the dead-band of the S-R latch phase detector 124.

Figure 8:
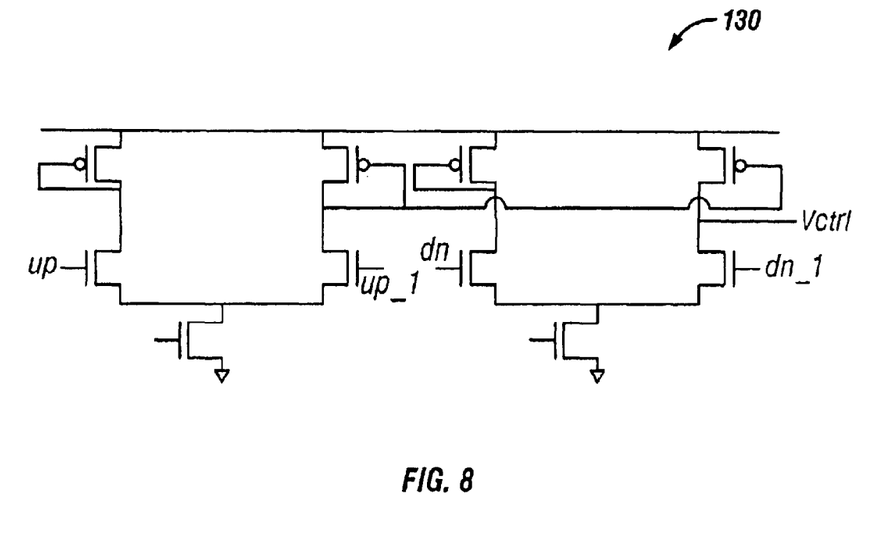
FIG. 8 shows a circuit schematic of a portion of a DLL.

FIG. 8 shows a circuit schematic of a charge pump 130 that is used in a DLL. The charge pump 130 either sources or sinks current at the $V_{ctrl}$ node (shown in FIG. 3) depending on values of UP and DOWN pulses (shown in FIG. 3) from a phase detector.

Figure 9:
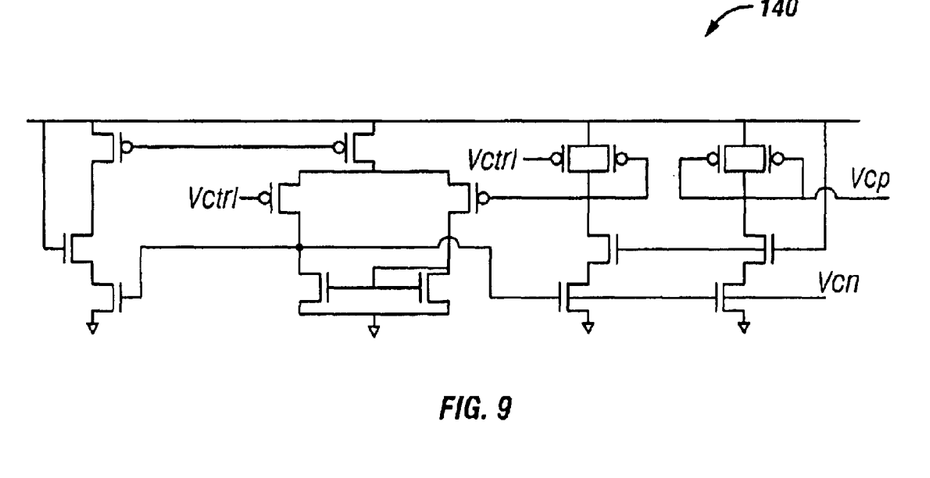
FIG. 9 shows a circuit schematic of a portion of a DLL.

FIG. 9 shows a circuit schematic of a bias generator 140 that is used in a DLL. The bias generator 140 uses feedback to self-bias itself and generate bias voltages $V_{cp}$ and $V_{cn}$ (also shown in FIG. 3) depending on $V_{ctrl}$. The bias voltage $V_{cp}$ and $V_{cn}$ bias delay elements in a voltage-controlled delay line of a DLL.

Figure 10:
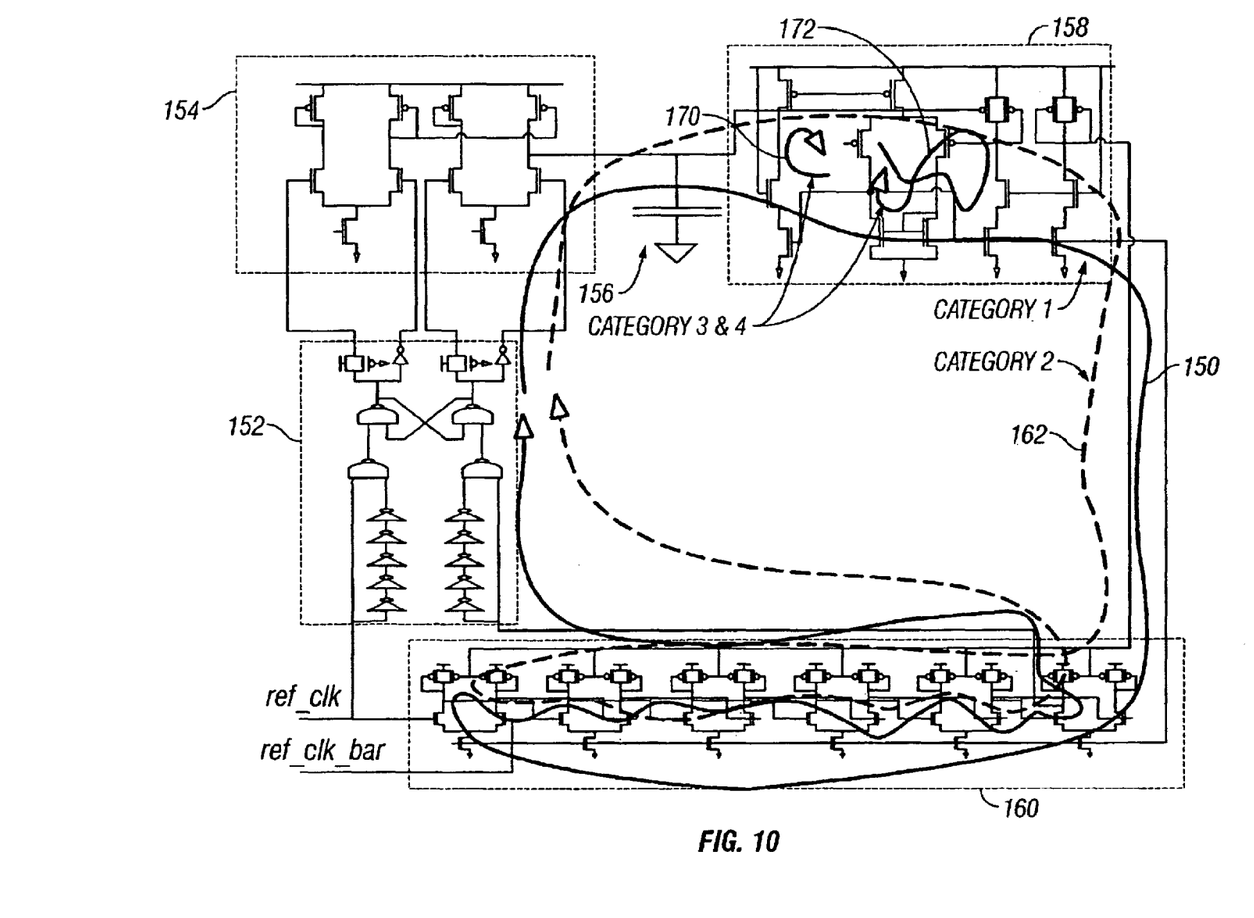
FIG. 10 shows various signal paths of interest in a portion of a DLL.

To implement stuck-at fault testing in the first loop of a DLL, a set of signal nodes on particular signal paths need to be selected and then these nodes need to be made controllable and observable. To this end, FIG. 10 shows various signal paths in the first loop of a DLL. For purposes of describing the present invention, the various signal paths fall into different categories and are described henceforth.

Category 1 paths 150 are signal paths that start from a phase detector 152 and go through a charge pump 154, a filter capacitance 156, a bias generator 158, NMOS tail-current devices of delay elements in a voltage-controlled delay line 160 and end at the phase detector 152. Category 2 paths 162 are signal paths the start from the phase detector 152 and go through the charge pump 154, the filter capacitance 156, the bias generator 158, PMOS triode-connected load device of the voltage-controlled delay line 160 and end at the phase detector 152. Category 3 paths 170 and category 4 paths 172 are feedback loop paths in the bias generator 158.

Those skilled in the art will understand that, for purposes of illustration, only one signal path of each type of category is shown in FIG. 10. However, these categories represent a plurality of signal paths of interest.

Figure 11:
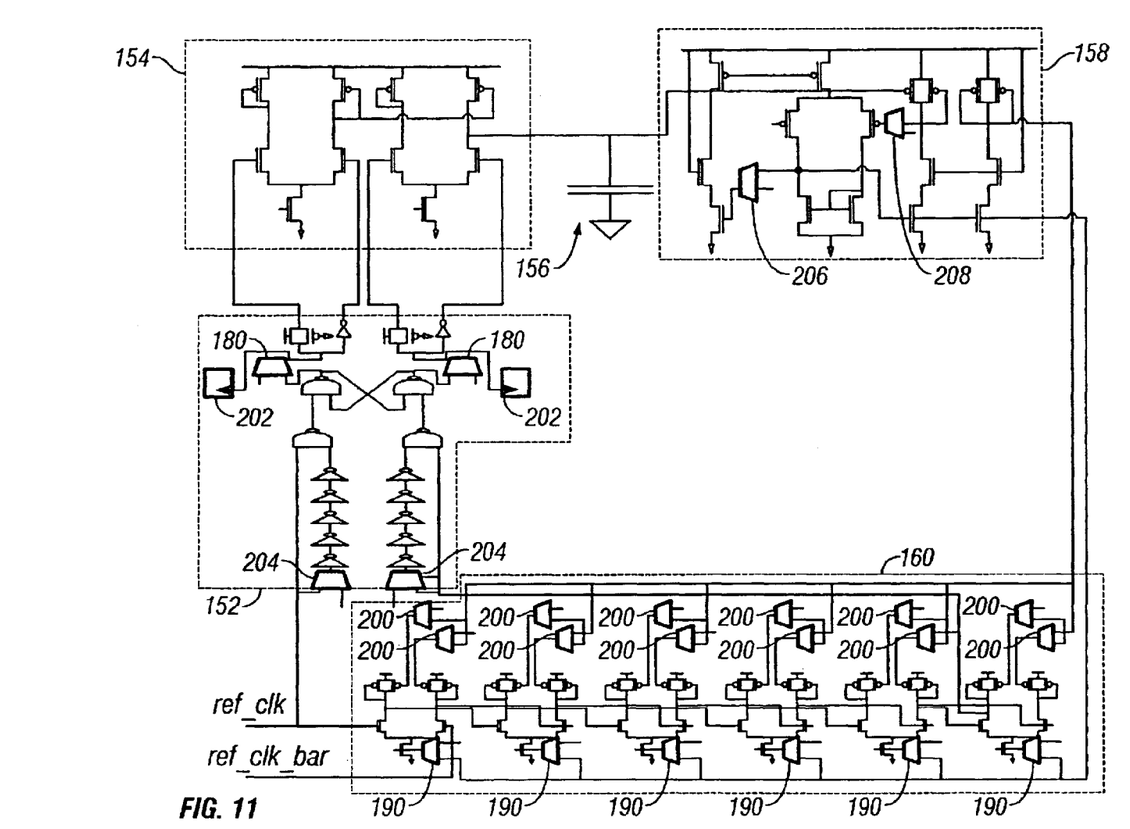
FIG. 11 shows a portion of a DLL in accordance with an embodiment of the present invention.

The determination of signal paths of interest as shown in FIG. 10 is used to determine the implementation of DFT features in a DLL. Accordingly, FIG. 11 shows a portion of a DLL in accordance with an embodiment of the present invention. To obtain controllability of category 1 and 2 signal paths (150 and 162 as shown in FIG. 10), a multiplexer 180 is positioned after the phase detector 152. Those skilled in the art will understand that the positioning of the multiplexers 180 as such is desirable because the phase detector 152 outputs digital signals at the points at which the multiplexers 180 are positioned.

The category 1 and 2 signal paths (150 and 162 as shown in FIG. 10) are also connected together through bias voltages $V_{cp}$ and $V_{cn}$ from the bias generator 158. To obtain controllability of these signal paths, the $V_{cp}$ and $V_{cn}$ signal lines are broken with a first set of multiplexers 190 before the inputs of the NMOS devices in the voltage-controlled delay line 160 and another set of multiplexers 200 before the inputs of the PMOS devices in the voltage-controlled delay line 160.

To obtain observability of category 1 and 2 signal paths, the outputs of the phase detector 152 may be fed into observability flops 202. In one or more embodiments, the phase detector 152 may be modified because its output pulses in normal operation might not be wide enough for the observability flops 202 to latch during testing. Thus, a multiplexer 204 may be substituted for an inverter in each of the input paths of the phase detector 152 to inhibit the generation of pulses during testing.

Because category 3 and 4 signal paths (170 and 172 as shown in FIG. 10) are local feedback loops in the bias generator 158, these paths may be bypassed during manufacturing tests by positioning multiplexers 206 and 208 at locations as shown in FIG. 11.

Figure 12:
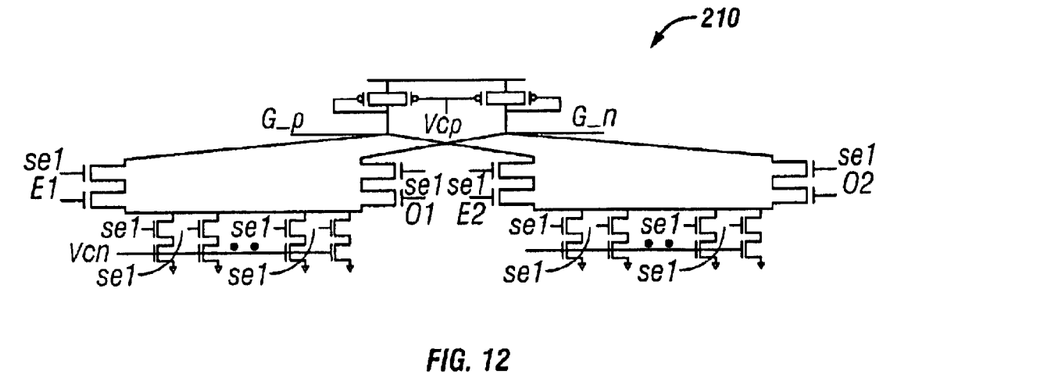
FIG. 12 shows a circuit schematic of a portion of a DLL.
Figure 13:
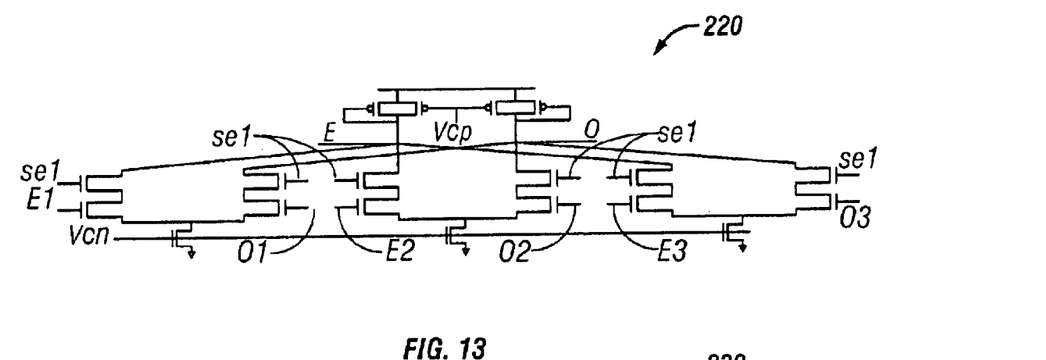
FIG. 13 shows a circuit schematic of a portion of a DLL.
Figure 14:
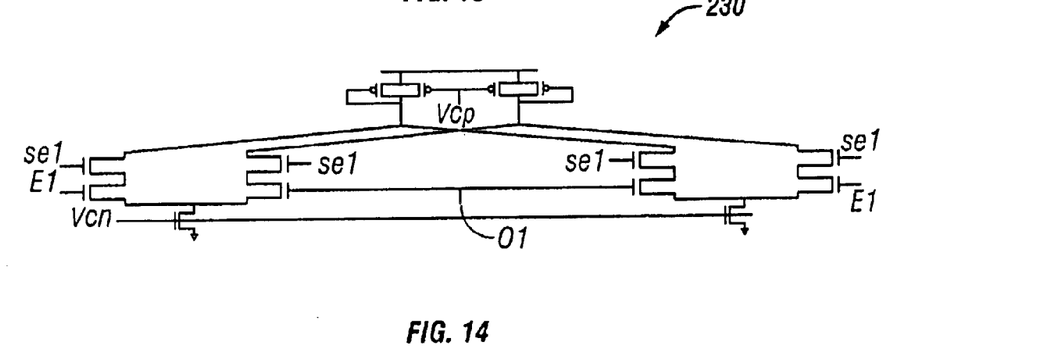
FIG. 14 shows a circuit schematic of a portion of a DLL.

To further describe the application of DFT features in a DLL, FIGS. 12–14 show exemplary circuit schematics of portions of a second loop of a DLL. FIG. 12 shows a circuit schematic of a phase interpolator 210 that is used in a DLL.

FIG. 13 shows a circuit schematic of a phase selector 220 that is used in a DLL. FIG. 14 shows a circuit schematic of a phase inverter 230 that is used in a DLL. Those skilled in the art will understand that the devices shown in FIGS. 12–14 are configured as source-coupled differential amplifiers.

Figure 15:
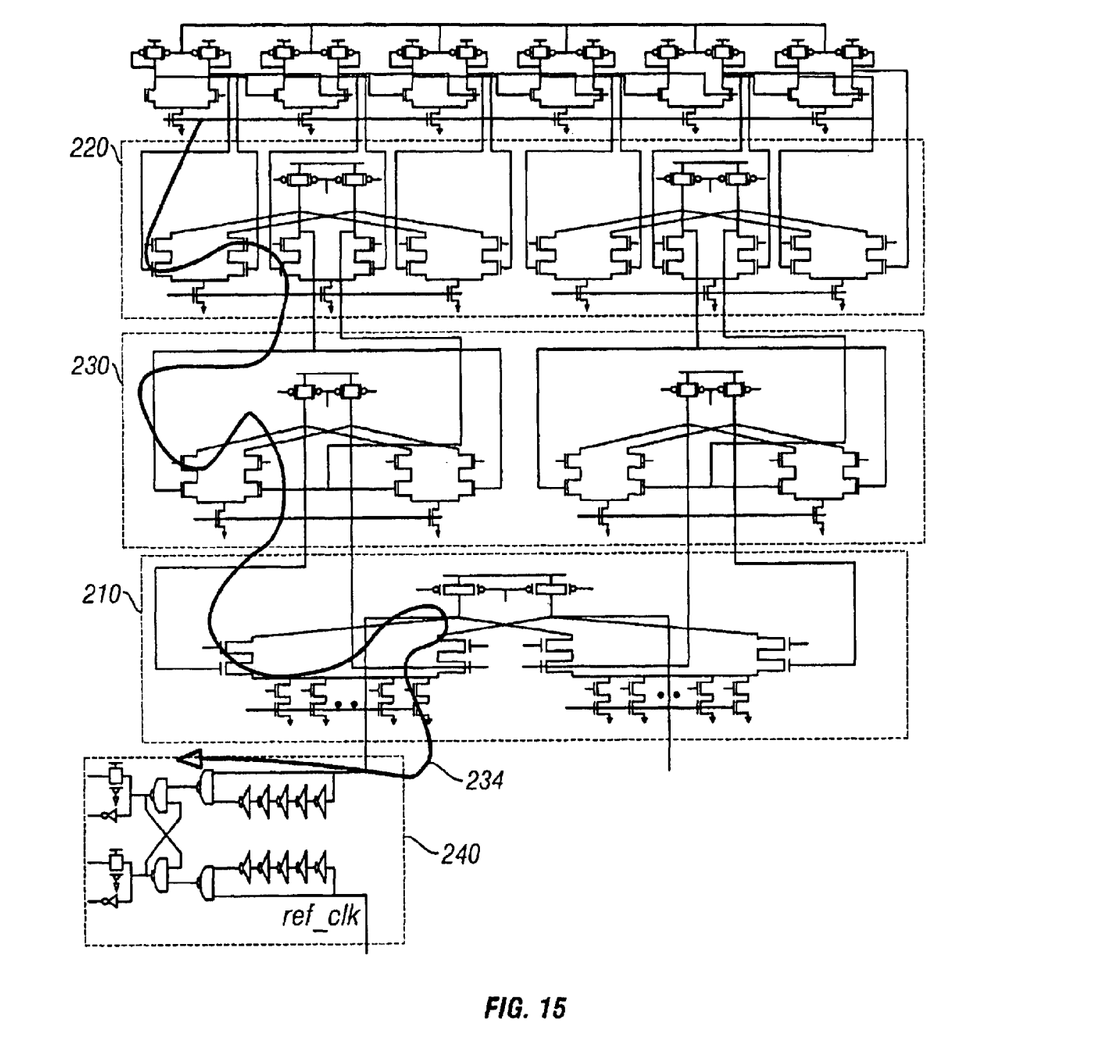
FIG. 15 shows a signal path of interest in a portion of a DLL.

To implement stuck-at fault testing in the second loop of a DLL, a set of signal nodes on particular signal paths need to be selected and then these nodes need to be made controllable and observable. To this end, FIG. 15 shows a signal path in the second loop of a DLL. With respect to the devices of the second loop of the DLL shown in FIG. 12–14, only one category of signal paths is defined. This signal path 234 begins at the input of the phase selector 220 and then traverses through the phase interpolator 210 and then ends at the phase detector 240 of the second loop. Because the output of the phase detector 240 is fed into a finite state machine (see FIG. 3) that typically already has scannable flip-flops, the signal path 234 is an open-loop path. Further, those skilled in the art will note that because the signal path 234 traverses through amplifiers that function as inverters during testing, the signal path 234 is similar in structure to a combinational logic path between two flip-flops in a typical digital design.

Those skilled in the art will understand that, for purposes of illustration, only one signal path is shown in FIG. 15. However, this category of signal path of interest is representative of a plurality of signal paths of interest in the second loop of the DLL. Each of these signal paths may be enabled or disabled by a particular combination of phase selector, phase interpolator, and phase inverted codes that may be already present in the design of the second loop of the DLL. Accordingly, in one or more embodiments, these signal paths may not need any multiplexers to implement controllability.

Observability of the signal paths represented by the signal path 234 may be obtained by scanning a flip-flop into which that phase detector 240 outputs are fed into in normal operation. Accordingly, to enable testing for stuck-at-faults in the second loop of the DLL, two multiplexers (not shown) are positioned are respectively positioned in each of the input paths of the phase detector 240 in order to prevent the phase detector 240 from producing pulses during testing.

Advantages of the present invention may include one or more of the following. In some embodiments, because DFT features may be implemented in a DLL, testing of the DLL may be performed before an integrated circuit containing the DLL is packaged.

In some embodiments, because a DLL may be stuck-at-fault tested before an integrated circuit containing the DLL is packaged, expensive resource consumption associated with post-packaging design may be reduced.

In some embodiments, because a DLL may incorporate DFT features to test for stuck-at-faults, DLL performance may be analyzed, controlled, tested, and/or improved.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit having a delay locked loop, comprising:
   a phase detector that inputs a reference clock signal and an output clock signal from the delay locked loop;
   a charge pump, responsive to an output from the phase detector, that outputs a control voltage signal;

a bias generator that generates at least one bias signal dependent on the control voltage signal;

a voltage-controlled delay line, responsive to the at least one bias signal, that outputs the output clock signal, wherein the voltage-controlled delay line comprises a plurality of delay elements that each comprise an NMOS device and a PMOS device;

a first plurality of design-for-test devices positioned at inputs to NMOS devices in the plurality of delay elements; and a second plurality of design-for-test devices positioned at inputs to PMOS devices in the plurality of delay elements.

2. The integrated circuit of claim 1, further comprising:

a design-for-test device positioned at an output of the phase detector.

3. The integrated circuit of claim 2, wherein the design-for-test device comprises a multiplexer.

4. The integrated circuit of claim 2, wherein the design-for-test device comprises a flip-flop.

5. The integrated circuit of claim 1, further comprising:

a design-for-test device positioned at an input of the phase detector, wherein the design-for-test device comprises a multiplexer.

6. The integrated circuit of claim 1, further comprising:

a design-for-test device positioned within the bias generator, wherein the design-for-test device comprises a multiplexer.

7. The integrated circuit of claim 1, further comprising:

a phase selector operatively connected to outputs of the plurality of delay elements;

a phase inverter that inputs an output from the phase selector, wherein the phase selector outputs dependent on a finite state machine operatively connected to the phase selector;

a phase interpolator responsive to the phase inverter, wherein the phase interpolator outputs to a second phase detector; and a design-for-test device positioned at an input of the second phase detector, wherein the design-for-test device comprises a multiplexer.

8. An integrated circuit having a delay locked loop, comprising:

means for inputting a reference clock signal and an output clock signal from the delay locked loop;

means for outputting a control voltage signal dependent on the means for inputting the reference clock signal and the output clock signal;

means for generating at least one bias signal dependent on the control voltage signal;

means for outputting the output clock signal dependent on the at least bias signal, wherein the means for outputting the output clock signal comprises a plurality of delay elements that each comprise an NMOS device and a PMOS device;

first testing means for testing the delay locked loop positioned at inputs to NMOS devices in the plurality of delay elements; and second testing means for testing the delay locked loop, wherein the first means is positioned at inputs to PMOS devices in the plurality of delay elements.

9. A method for performing operations using a delay locked loop, comprising:

inputting a reference clock signal and an output clock signal from the delay locked loop;

outputting a control voltage signal dependent on the means for inputting the reference clock signal and the output clock signal;

generating at least one bias signal dependent on the control voltage signal;

outputting the output clock signal dependent on the at least one bias signal, wherein outputting the output clock signal is dependent on a plurality of delay elements that each comprise an NMOS device and a PMOS device; and testing the delay locked loop, wherein the testing uses a first plurality of devices positioned at inputs to NMOS devices in the plurality of delay elements.

10. The method of claim 9, wherein the testing uses a second plurality of devices positioned at inputs to PMOS devices in the plurality of delay elements.

11. The method of claim 9, wherein inputting the reference clock signal and the output clock signal uses a phase detector, wherein the testing uses a first design-for-test device positioned at an output of the phase detector.

12. The method of claim 11, wherein the testing uses a second design-for-test device positioned at an input of the phase detector.

13. An integrated circuit having a delay locked loop, comprising:

a phase detector that inputs a reference clock signal and an output clock signal from the delay locked loop;

a first design-for-test device positioned at an output of the phase detecto, the first design-for-test device being controllable to selectively establish a value on the output of the phase detector;

a charge pump, responsive to an output from the phase detector, that outputs a control voltage signal;

a bias generator that generates at least one bias signal dependent on the control voltage signal; and a voltage-controlled delay line, responsive to the at least one bias signal, that outputs the output clock signal.

14. The integrated circuit of claim 13, wherein the first design-for-test device comprises a multiplexer.

15. The integrated circuit of claim 13, wherein the first design-for-test device comprises a flip-flop.

16. The integrated circuit of claim 13, further comprising:

a second design-for-test device positioned at an input of the phase detector, wherein the second design-for-test device comprises a multiplexer.

17. The integrated circuit of claim 13, wherein the voltage-controlled delay line comprises a plurality of delay elements that each comprise an NMOS device and a PMOS device.

18. The integrated circuit of claim 17, further comprising:

a first plurality of design-for-test devices positioned at inputs to NMOS devices in the plurality of delay elements; and a second plurality of design-for-test devices positioned at inputs to PMOS devices in the plurality of delay elements.

19. An integrated circuit having a delay locked loop, comprising:

a phase detector arranged to input a reference clock signal and an output clock signal from the delay locked loop;

a charge pump, responsive to an output from the phase detector, arranged to output a control voltage signal;

a bias generator arranged to generate at least one bias signal dependent on the control voltage signal;

a voltage-controlled delay line, responsive to the at least one bias signal, arranged to output the output clock signal; and a design-for-test device controllable to selectively establish a value on any one of an input an output of at least one selected from the group consisting the phase detector, the charge pump, the bias generator, and the voltage-controlled delay line.

20. The integrated circuit of claim 19, wherein the design-for-test device comprises a multiplexer.

21. The integrated circuit of claim 19, wherein the design-for-test device is a flip-flop.

* * * * *

UNITED STATES PATENT AND TRADEMARK OFFICE
CERTIFICATE OF CORRECTION

PATENT NO.    : 6,815,986 B2
DATED         : November 9, 2004
INVENTOR(S)   : Aninda K. Roy et al.

It is certified that error appears in the above-identified patent and that said Letters Patent is hereby corrected as shown below:

Column 8,
Line 31, please replace "detecto" with -- detector --.

Column 9,
Line 7, please place -- and -- after "input".

Signed and Sealed this

Nineteenth Day of April, 2005

JON W. DUDAS
*Director of the United States Patent and Trademark Office*